United States Patent [19]

Luijtjes et al.

[11] Patent Number: 4,978,835
[45] Date of Patent: Dec. 18, 1990

[54] METHOD OF CLAMPING ELECTRICAL CONTACTS FOR LASER BONDING

[75] Inventors: Nicolaas G. Luijtjes; Claire T. Galanakis; Barry H. Whalen, all of Austin, Tex.

[73] Assignee: Microelectronics and Computer Technology Corporation, Austin, Tex.

[21] Appl. No.: 396,254

[22] Filed: Aug. 21, 1989

[51] Int. Cl.⁵ .................................... B23K 26/00
[52] U.S. Cl. ............................ 219/121.64; 219/85.13
[58] Field of Search .................. 219/121.63, 121.64, 219/121.6, 121.85, 85.13

[56] References Cited

U.S. PATENT DOCUMENTS

| | | | |
|---|---|---|---|
| 3,485,996 | 12/1969 | Chiou et al. | 219/121.63 |
| 3,570,055 | 7/1970 | Jannett | 219/121.63 X |
| 4,320,281 | 3/1982 | Cruickshank et al. | 219/121.64 |
| 4,341,942 | 7/1982 | Chaudhari et al. | 219/121.64 |
| 4,404,453 | 9/1983 | Gotman | 219/121.64 |
| 4,547,652 | 10/1985 | Raisig et al. | 219/121.64 |
| 4,700,044 | 10/1987 | Hokanson et al. | 219/121.63 |
| 4,785,156 | 11/1988 | Benko et al. | 219/121.64 |

OTHER PUBLICATIONS

Frausto et al., "Method of Bonding an Electrically Conductive Material to an Electrically Conductive Layer Which Overlies a Curved Non-Metallic Substrate." U.S. Statutory Registration No. H158.

*Primary Examiner*—C. L. Albritton
*Attorney, Agent, or Firm*—Fulbright & Jaworski

[57] ABSTRACT

A method of bonding a first plurality of electrical contacts to a second plurality of electrical contacts by aligning the first and second contacts, placing a diaphragm member against the first contacts and applying a differential pressure, such as a vacuum, to the diaphragm in a direction to pull the first contact toward the second contact. Thereafter, the first contacts are bonded to the second contacts with a laser. The diaphragm or a coating on the diaphragm can be a material that absorbs energy from the laser to transfer laser energy to the bond. The diaphragm may be a glass plate or a transparent membrane, may have a support bonded to the first contacts, and may include openings through which the contacts are bonded.

9 Claims, 4 Drawing Sheets

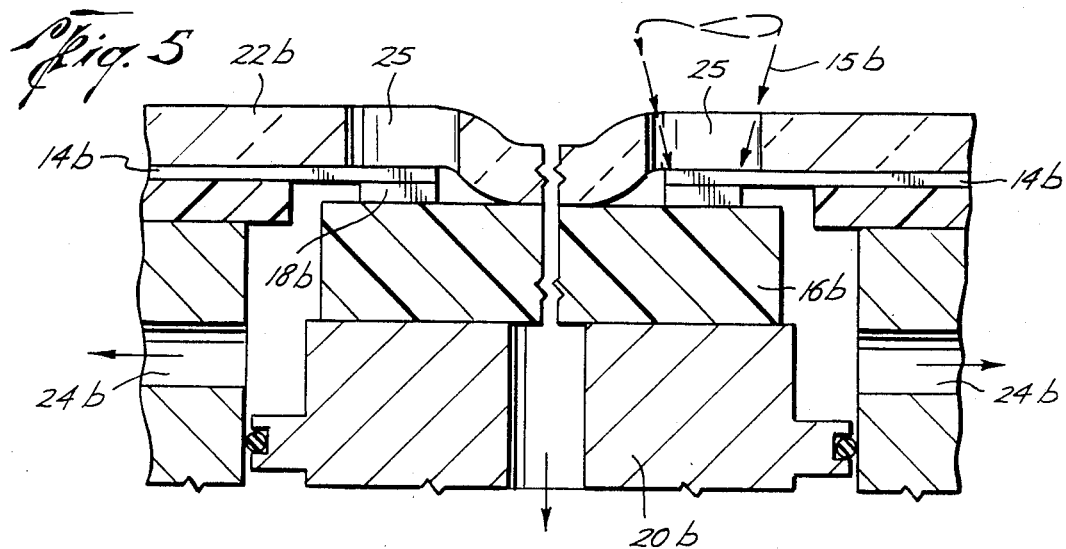
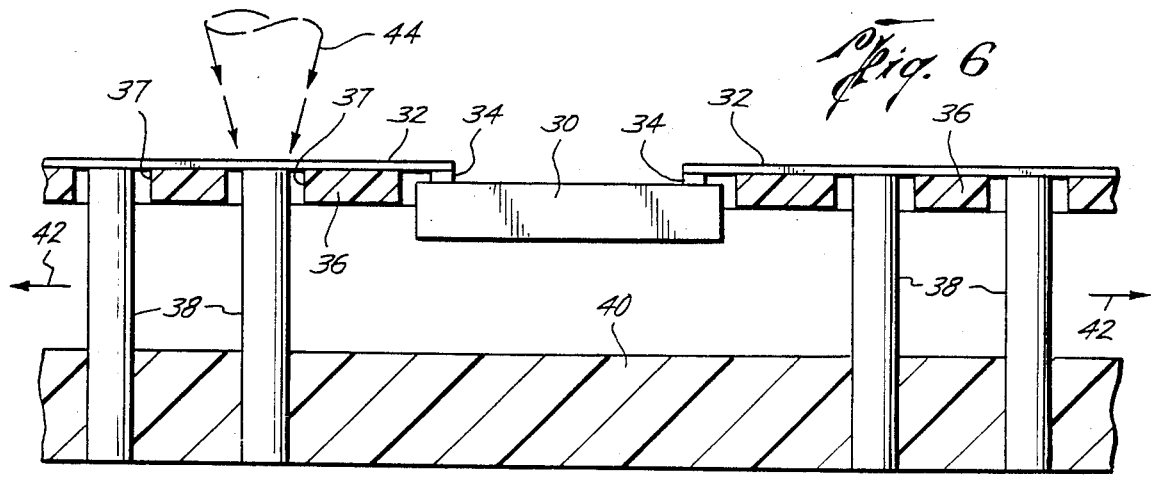
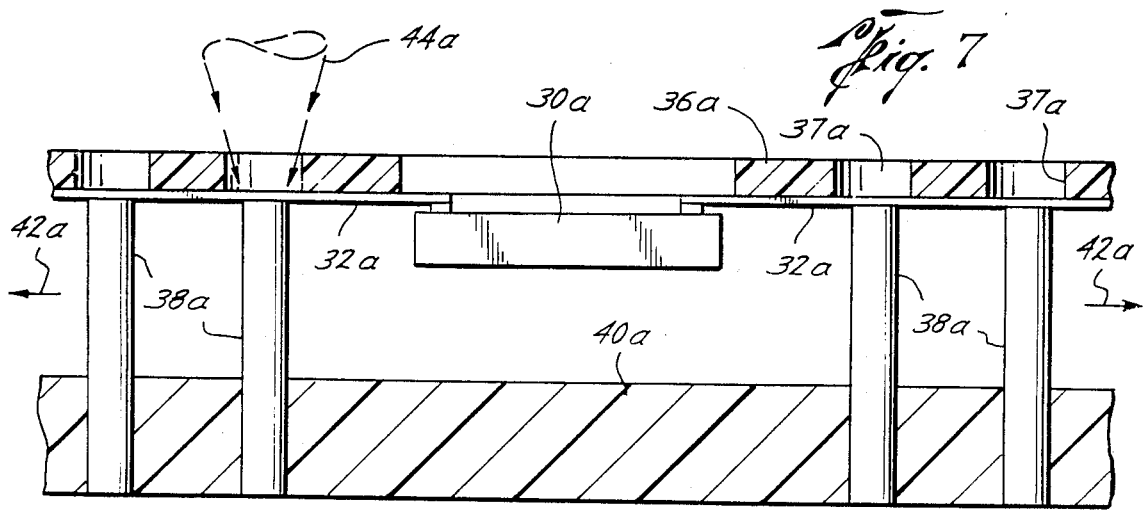

4,978,835

METHOD OF CLAMPING ELECTRICAL CONTACTS FOR LASER BONDING

BACKGROUND OF THE INVENTION

The present invention is directed to a method of clamping electrical contacts together for laser bonding the contacts and for improving the transfer of laser energy to the bond. In particular, the present invention is directed to an interlead bonding of a tape automated bonding (TAB) tape to an integrated circuit die.

One of the problems in laser bonding is holding the electrical contacts which are to be bonded together, properly aligned, and in proper contact to provide a good bond. U.S. Pat. No. 4,845,335 to Andrews et al. issued July 4, 1989 for Laser Bonding Apparatus and Method which discloses various mechanical structures and the use of a gas stream to hold first and second electrical contacts in engagement for bonding, as well as a method of bonding electrical leads to electrical bumps by providing the electrical leads with a coating that is coupled to the wavelength of the laser and has a lower melting point than the melting point of the leads or the bumps, and is hereby incorporated by reference.

The present invention is directed to various improvements in the method of clamping electrical contacts, both keeping the contacts in proper position and in proper engagement for laser bonding This becomes particularly important in bonding either in inner or outer electrical leads of a TAB tape. For example, bonding of TAB tape inner leads to an integrated circuit die, either having bumps or bumpless, is difficult because of the small sizes of the leads and bumps, if any, involved.

SUMMARY

The present invention is directed to a method of bonding a first plurality of electrical contacts to a second plurality of electrical contacts and includes aligning the first contacts over the second contacts and placing a diaphragm member against the first contacts. The method further includes applying a force to the diaphragm in a direction to move the first contacts toward the second contacts, holding them in position, and thereafter bonding the first contacts to the second contacts with a laser. For example, the force may be provided by a differential pressure, mechanical means such as a spring, or the weight of the diaphragm.

Another object of the present invention is wherein the diaphragm is a glass plate for holding the first and second contacts in position. In another embodiment, the glass plate is flexible for clamping the first and second contacts in intimate engagement.

A still further object is wherein the diaphragm is a compliant membrane which will hold and clamp the contacts. Some embodiments of membranes absorb laser heat for assisting in the laser bonding.

Yet a further object of the present invention is wherein the diaphragm includes support means connected to and supporting the first contacts.

A further object of the invention includes supplying a vacuum for holding one of the first or the second contacts in position Yet a still further object of the present invention is wherein the diaphragm includes openings and the method includes the steps of aligning the openings with the aligned first and second contacts and bonding the first and second contacts through the openings.

Still a further object is wherein the diaphragm consists of a material or includes a coating of a material for absorbing the laser energy in order to heat the contacts.

A still further object is the method of bonding a plurality of electrical leads of a TAB tape to a plurality of electrical contacts on an integrated circuit die by a laser which includes aligning the electrical leads of a TAB tape over the electrical contacts and covering the electrical leads with a diaphragm. The method includes applying a differential pressure, by means of a vacuum to the underside of the diaphragm, or a positive pressure to the top of the diaphragm, to move the electrical leads toward the electrical contacts, and thereafter bonding the electrical leads to the contacts with a laser.

Other and further objects, features and advantages will be apparent from the following description of presently preferred embodiments of the invention, given for the purpose of disclosure and taken in conjunction with the accompanying drawings.

BRIEF DESCRIPTION OF THE DRAWINGS

FIG. 5 is an enlarged fragmentary elevational view, in cross-section, illustrating still another embodiment of the present invention for bonding electrical leads to bumps, FIG. 6 is an enlarged fragmentary elevational view, in cross-section, illustrating a method of supporting and bonding pins in a substrate to electrical leads on an integrated die, FIG. 7 is an enlarged fragmentary elevational view, in cross-section, illustrating another method of laser bonding of metal pins in a substrate to electrical leads from an integrated circuit die.

DESCRIPTION OF THE PREFERRED EMBODIMENT

While the present invention will describe, for purpose of illuStration only, the laser bonding of tape automated bonding of TAB lead frames to integrated circuit dies, the present method of clamping electrical contacts for laser bonding and for improving the transfer of laser energy to the bond is applicable to laser bonding of other types of electrical contacts to each other. Bonding as described herein includes soldering, welding, alloying, brazing, or other means known to those having skill in the art for mechanically and electrically joining two electrical members.

Figure 1:
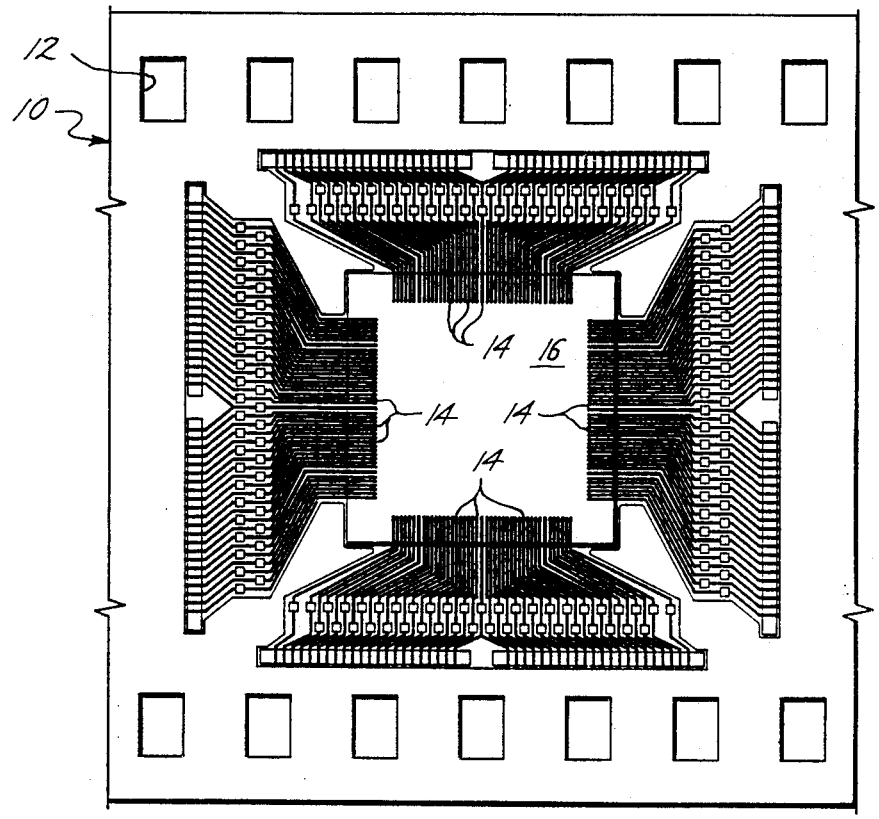
FIG. 1 is a fragmentary enlarged elevational view of a TAB tape with an integrated circuit die in place for bonding.
Figure 2:
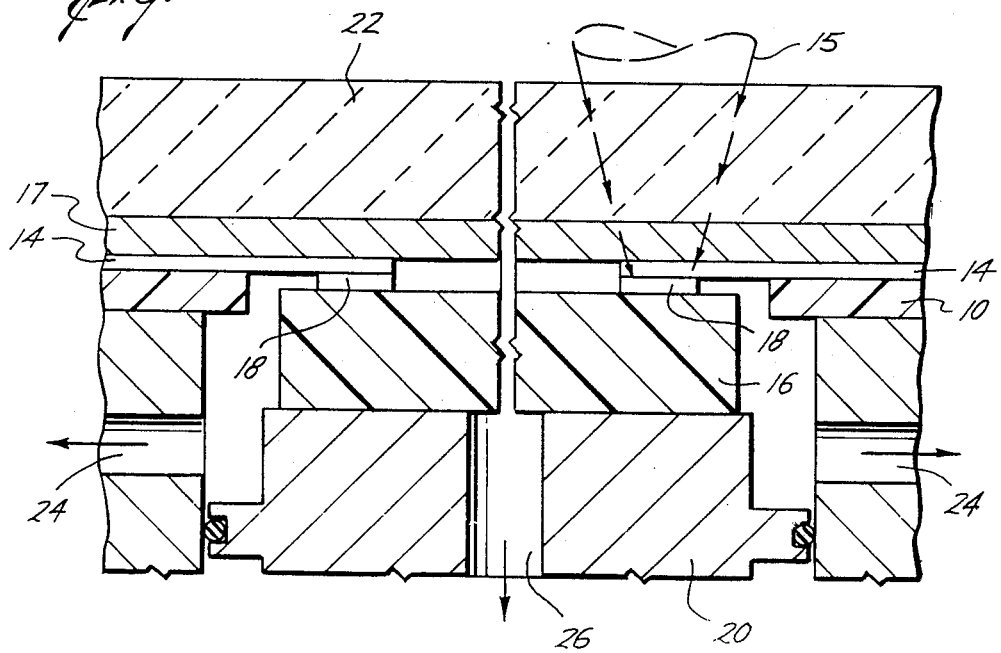
FIG. 2 is an enlarged schematic elevational view, in cross-section, illustrating one method of holding, supporting and bonding the electrical leads of FIG. 1 to electrical bumps on the die.
Figure 3:
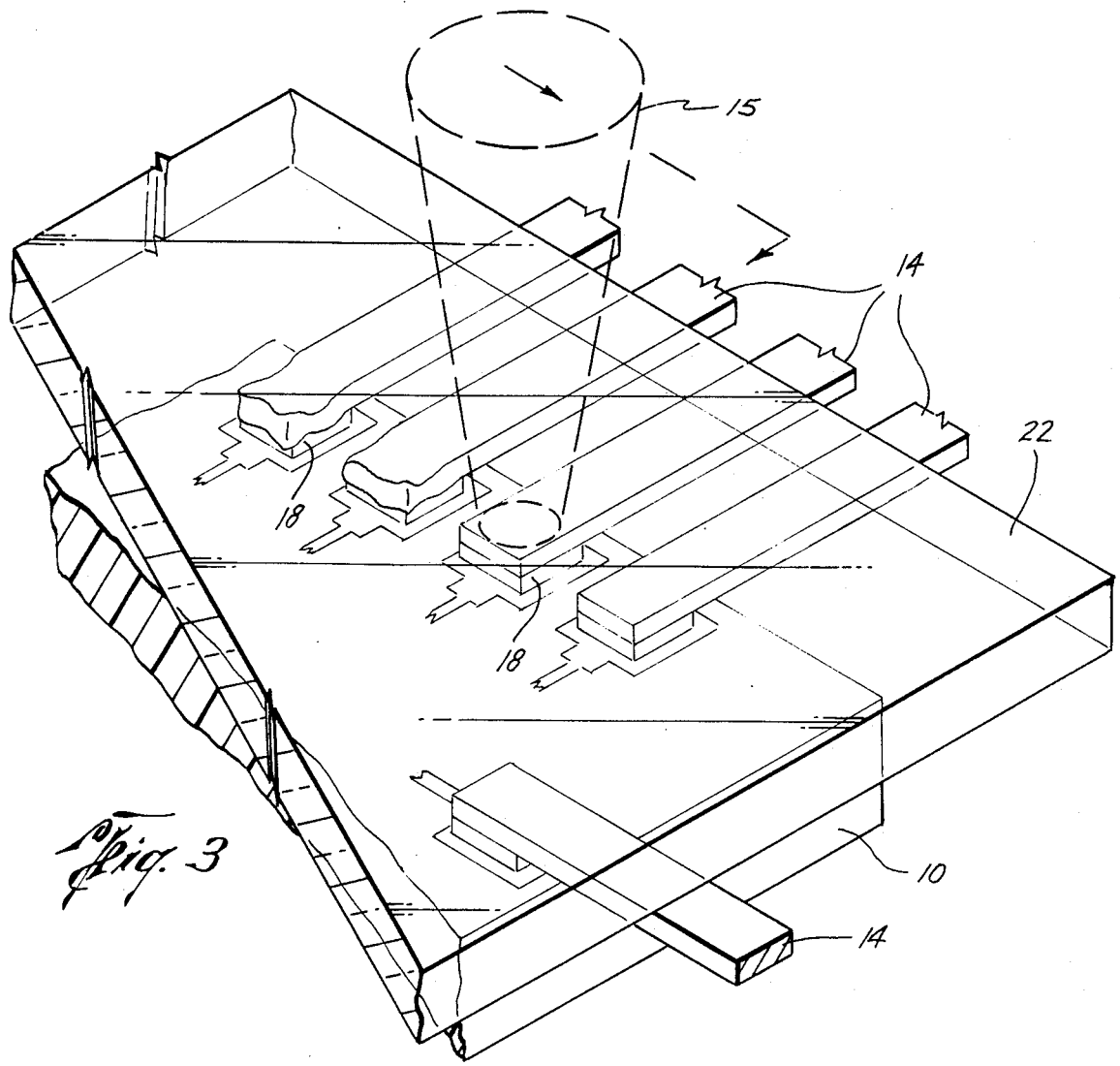
FIG. 3 is an enlarged fragmentary perspective view of bonding the electrical leads to the bumps of FIG. 2.

Referring now to the drawings, and particularly to FIG. 1, the reference numeral 10 generally indicates a portion of a tape automated bonding (TAB) tape having the usual sprocket holes 12 and a plurality of inner leads 14 for bonding to an integrated circuit die 16 having active semiconductor circuitry. The present invention is advantageous by supporting, maintaining alignment and clamping, as best seen in FIGS. 2 and 3, of the first contacts or inner leads 14 relative to the second contacts or bumps 18. Thereafter, a localized, concentrated laser beam 15 may be used to bond the plurality of first contacts or leads 14 to the second plurality of electrical contacts or bumps 18. Presently, in a typical lead-bump connection, the bumps 18 are square bumps 25 microns thick with each side approximately 4.4 mils long and the leads 14 are 1.3 mils thick and 3 mils wide. However, these sizes are presently becoming smaller and therefore the importance of the alignment, maintaining the positioning, and the engagement between the members 14 and 18 become more important.

A support 20 is provided for supporting the die 16 as well as the tape 10. The tape 10 is moved relative to the die 16 for bringing each of the inner leads 14 into alignment and nominal contact with one of the bumps 18. In order to hold the leads 14 in uniform alignment, maintain their position, and be in intimate contact with the bumps 18, a diaphragm 22 is placed against the inner leads 14. As best seen in FIGS. 2 and 3, the diaphragm 22 may be a conventional, standard glass slide which has a nominal thickness of approximately 40 mils. The diaphragm or glass slide 22 will rest on top of the leads 14, maintain them in alignment with their respective bumps, and will aid in making a good contact between the interface between the leads 14 and the bumps 18. Alignment of the leads 14 and bumps 18 can be easily viewed through the transparent glass.

As an additional embodiment, the diaphragm 22 may position leads 14 and bumps 18 so that they align, but with a gap between them instead of there being contact. This gap can be advantageous because there is less conductive heat through the die 16 which provides better control of the melting of leads 14. A typical gap distance is 1 to 5 mils.

A pressure differential is applied to the diaphragm 22 to clamp the leads 14 to the bumps 18. One embodiment includes a support 20 having one or more passageways 24 which are connected to a vacuum which is applied to the underside of the glass 22 in a direction to pull the leads 14 toward the bumps 18 thereby increasing the uniformity of contact between the leads 14 and the bumps 18. In addition, if desired, the support 20 may include another vacuum passageway 26 for applying a vacuum to the underside of the die 16 thereby aiding in maintaining the position of the die relative to the support 20. Therefore, the vacuum acting on the underside of the glass plate 22 not only maintains contact between the leads 14 and the bumps 18, but also maintains the leads 14 and bumps 18 in position during the laser bonding process. Preferably, the cross-sectional area of the vacuum inlet 24 will greatly exceed the cross sectional area near the diaphragm 22, in order to provide sufficient force from the diaphragm 22 to the leads 14. For example, applying a vacuum pressure of 5–20 inches mercury has been found satisfactory. As best seen in FIGS. 2 and 3, a laser beam 15 is applied to each of the inner faces between the leads 14 and the bumps 18 for bonding them together. Any suitable laser may be used such as a YAG laser.

If desired, the glass plate diaphragm 22 may be thinner such as 4–8 mils, for allowing it to be more flexible thereby further clamping the first contacts or leads 14 and the second contacts or bumps 18 in intimate engagement in spite of variations of the thickness of the various contacts 14 and 18.

It is to be noted that there is some air leakage from above the TAB tape 10, through the spaces between the individual leads 14 to the underside of the glass 22. However, the total size of this leakage is insufficient to prevent a vacuum from being applied to the underside of the glass 22. That is, total the cross-sectional area of the passageways 24 leading to the underside of the glass 22 is many times greater than the leakage area between the leads 14.

If desired, a suitable absorbent material 17 may be applied to the bottom of the diaphragm 22 for absorbing energy from the laser beam 15 and producing heat adjacent to the contacts to be bonded. For example, suitable absorbent materials for coating diaphragm 22 can be titanium, chromium, tin, tungsten, nickel, and even ink. The thickness of material 17 is preferably 0.2 to 1 micrometer thick.

Figure 4:
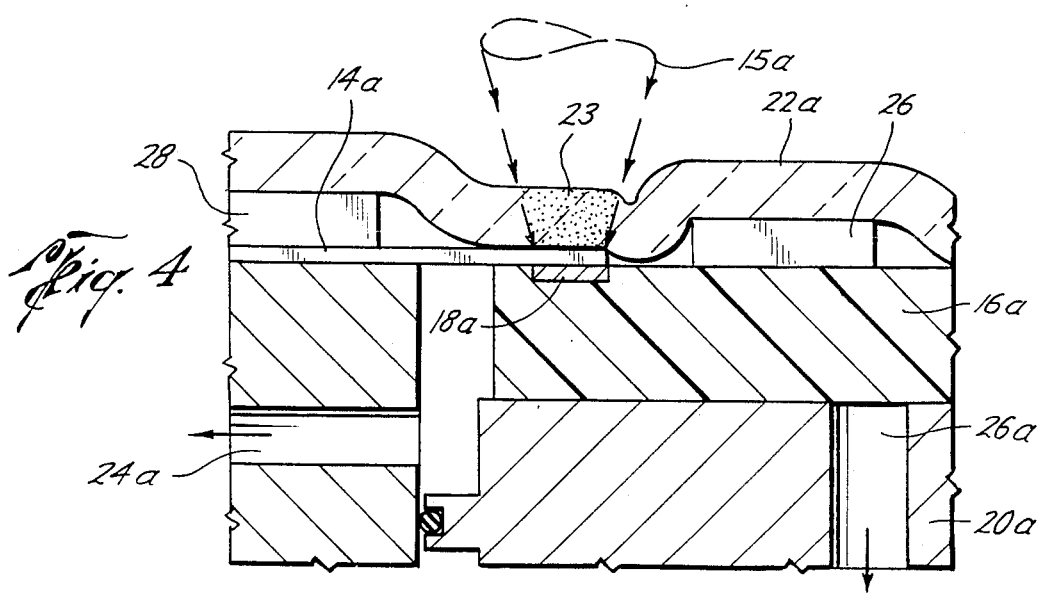
FIG. 4 is an enlarged fragmentary elevational view, in cross-section, of another embodiment of the present invention.

Of course, other embodiments may be provided. As best seen in FIG. 4, another embodiment is shown wherein like parts to those shown in FIGS. 1–3 are similarly numbered with the addition of the suffix "a". In this particular structure, it is not feasible to utilize a rigid glass diaphragm because of the surface configuration of the devices being bonded. For example, the die 16a has a plurality of bumpless contacts 18a, but also a lid 26 and the plurality of leads 14a are supported from a polymer support 28. In order to provide a diaphragm which will be responsive to the vacuum through the passageways 24a and which will act to maintain the position of and the contacts between the leads 14a and contacts 18a, the diaphragm 22a is any suitable compliant membrane. If the leads 14a are laser energy absorbent then preferably the membrane is an optically transparent membrane that need not absorb laser energy, such as F.E.P. plastic sold under the trademark "TEFLON" having a thickness of 1 mil. This material does not absorb the heat and also does not leave debris. Alternatively, if the leads 14a are not laser energy absorbent then preferably either a laser absorbent diaphragm 22a is used, or a laser absorbent material 17 is coated on the diaphragm. It is noted that the embodiment of FIGS. 1–3 uses a laser absorbent material 17 applied the diaphragm 22; however, as shown in FIG. 4, the diaphragm 22a may itself be of a type which does or does not absorb laser energy, as desired. That is, if the contacts to be bonded do not adequately absorb the laser energy, the diaphragm, whether compliant or not, can be of a material or be coated with a material which is coupled to the wavelength of the laser to improve the energy absorption of the laser energy for providing a better bonding action between the contacts. A compliant laser absorbent diaphragm 22a can be a conventional plastic sold under the trademark "SARAN" having a thickness of 0.5 mil, or can be polyimide sold under the trademark "KAPTON" having a thickness of 1 mil. Examples of laser absorbent materials 17 have been previously described.

The choice between a laser absorbent diaphragm or a diaphragm coated with laser absorbent material will depend on the application. The laser absorbent diaphragm has the advantage that it can be optically transparent thereby allowing visibility of the underlying leads and contacts which may not be visible when a laser absorbent coating is used. However, a laser absorbent coating has the advantage that such coatings typically do not leave debris near the bond site after laser bonding has occurred, whereas laser absorbent diaphragms will typically leave debris near the bond site subsequent to laser bonding. For example, the plastic transparent membrane 22a has the advantage over glass in that when it is subjected to the laser beam 15a, the plastic membrane decomposes at section 23, decomposes, and tends to absorb heat from the laser beam 15a. This is advantageous in localizing the heat against the contacts 14a and 18a to be bonded. However, this process has the possible disadvantage in that the debris in section 23 of the decomposed membrane 22a may require cleaning after the bonding operation, but is advantageous as it allows for bonding electrical contacts 14a and 18a formed of materials that may not absorb significant amounts of energy from laser beam 15a, such as gold, copper, silver, and aluminum. The polyimide achieves the same function as the plastic by having a substantial optical absorption, such as 50-70%.

Another embodiment of the present invention is best seen in FIG. 5, wherein like parts to those shown in FIGS. 1-3 are similarly numbered with the addition of the suffix "b". In this case, a diaphragm 22b may be used, preferably a compliant membrane of a material similar to those disclosed in connection with the embodiment of FIG. 4, but in which openings 25 are provided for alignment between the leads 14b and the bumps 18b. This allows bonding of the first contacts 14b with the second contacts 18b through the openings 25 without leaving a residue thereon which might require cleaning.

Referring now to FIG. 6, another embodiment showing the versatility of the present method is best seen. An integrated circuit die 30 is provided having a plurality of leads 32 bonded to bumps 34. The leads 32 are provided with support means 36 such as a suitable polymer. In this application, it is desired to bond the leads 32 to a plurality of second contacts such as metal pins 38 which are connected to a substrate 40. The method of the present invention is particularly applicable as the height of the various pins 38 may not be the same. Therefore, the die 30 along with the connected leads 32 and their support 36, having openings 37 at locations where it is desired to insert one of the pins 38, is positioned, as best seen in FIG. 6, on top of the pins 38. This aligns the electrical leads 32 with the pins 38. A vacuum is applied to the bottom of the support 36, as indicated by arrows 42, for maintaining position of the leads 32 relative to the pins 38. Thereafter, the desired bonds are performed by the laser beam 44.

Referring to FIG. 7, a still further embodiment of the present invention is best seen wherein like parts to those shown in FIG. 6 are similarly numbered with the addition of the suffix "a". In this case, it is again desired to connect the electrical leads 32a from the die 30a to pins 38a of a substrate 40a. Again, the leads 32a are supported and held together by a suitable polymer support 36a having openings 37a at the locations at which it is desired to bond one of the leads 32a to one of the pins 38a. Again, a vacuum is applied in the direction of the arrows 42a and a laser beam 44a bonds the connections. However, in the embodiment of FIG. 7, the leads 32a and the supports 36a are reversed as compared with the embodiment of FIG. 6.

Figure 8:
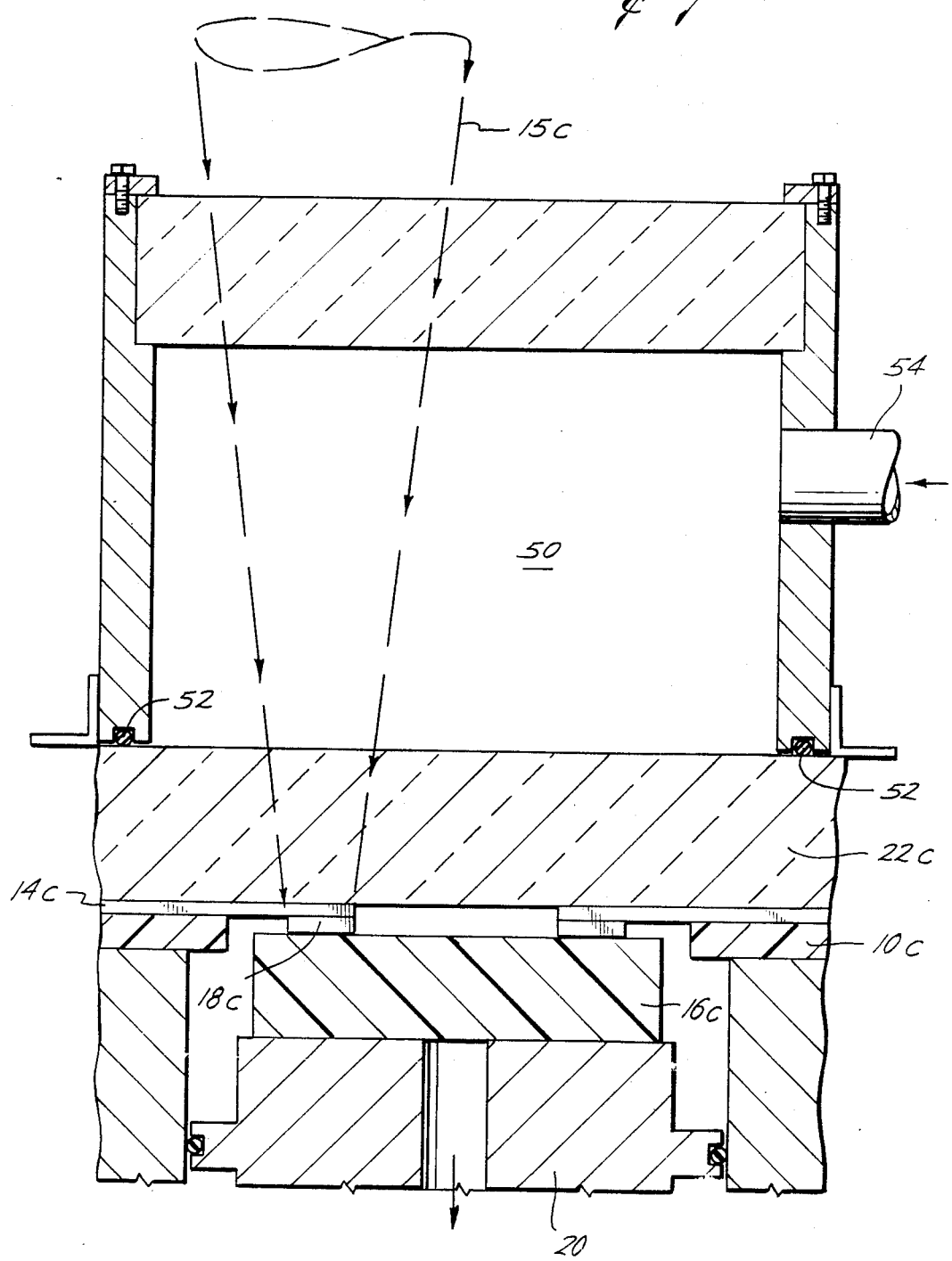
FIG. 8 is an enlarged schematic elevational view, in cross-section, illustrating a still further embodiment of the present invention.

Referring now to FIG. 8, another embodiment of the present invention is best seen in which the differential pressure clamping the first electrical contacts 14c to the second electrical contacts 18c is a positive pressure applied to one side of the diaphragm 22c. In this embodiment a chamber 50 is provided which is positioned in engagement with the diaphragm 22c and preferably sealed by seals 52. The chamber includes an inlet 54 to which a gas or fluid, for example air, is applied. The air enters the chamber 50, and is applied against the top of diaphragm 22c for clamping the leads 14c to the bumps 18c during the bonding by laser beam 15c.

While the above embodiments have described a gas differential pressure for acting on the diaphragm as a force, other positive or negative pressures can act as the source of the force. For instance, liquid differential pressure, mechanical means such as springs, or merely the weight of the diaphragm can be used to move the first contacts toward the second contacts.

The present invention, therefore, is well adapted to carry out the objects and attain the ends and advantages mentioned as well as others inherent therein. While presently preferred embodiments of the invention have been given for the purpose of disclosure, numerous changes in the details of construction, arrangement of parts, and steps of the process, will be readily apparent to those skilled in the art and which are encompassed within the spirit of the invention and the scope of the appended claims.

What is claimed is:

1. A method of bonding a first plurality of electrical contacts to a second plurality of electrical contacts comprising,
   aligning the first contacts over the second contacts,
   placing a diaphragm member which includes a laser absorbent material for absorbing laser energy against the first contacts,
   applying a force to the diaphragm in a direction to pull the first contacts toward the second contacts, and
   bonding the first contacts to the second contacts with a laser.

2. The method of claim 1 wherein the laser absorbent material is selected from a group consisting of titanium, chromium, tin, tungsten, nickel and ink.

3. The method of claim 1 wherein the laser absorbent material has a thickness of about from 0.2 to 1 micrometers.

4. The method of claim 1 wherein the absorbent material is coupled to the wavelength of the laser.

5. The method of claim 1 wherein the laser absorbent material is coated on the bottom of the diaphragm.

6. The method of claim 1 wherein the laser absorbent material has an optical absorption from about 50 to 70 percent.

7. A method of bonding a first plurality of electrical contacts to a second plurality of electrical contacts comprising,
   aligning the first contacts over the second contacts,
   placing a diaphragm member, which includes openings, against the first contacts,
   aligning the openings with the aligned first and second contacts,
   applying a force to the diaphragm in a direction to pull the first contacts toward the second contacts, and
   bonding the first contacts to the second contacts through the openings with a laser.

8. A method of bonding a plurality of electrical leads of a TAB tape to a plurality of electrical contacts on an integrated circuit die by a laser comprising,
   aligning the electrical leads of a tab tape over the electrical contacts, covering the electrical leads with a gas diaphragm which includes openings, aligning the openings with the aligned leads and contacts, applying a vacuum to the underside of the gas diaphragm to pull the electrical leads toward the electrical contacts and hold them in position, and bonding the electrical leads to the contacts through the openings with a laser.

9. A method of bonding a plurality of electrical leads of a TAB tape to a plurality of electrical contacts on an integrated circuit die by laser comprising, aligning the electrical leads of a TAB tape over the electrical contacts, covering the electrical leads with a gas diaphragm, said diagraphm including a laser absorbent material for absorbing laser energy, applying a vacuum to the underside of the diaphragm to pull the electrical leads towards the electrical contacts and hold them in position, and bonding the electrical leads to the contacts with a laser.

* * * * *